(12) United States Patent
Nunez Blanco et al.

(10) Patent No.: US 12,392,818 B2
(45) Date of Patent: Aug. 19, 2025

(54) ENHANCED JET IMPINGEMENT LEAK PREVENTION FOR INTEGRATED CIRCUIT

(71) Applicant: Intel Corporation, Santa Clara, CA (US)

(72) Inventors: Ruben Nunez Blanco, Gilbert, AZ (US); Christopher Ackerman, Phoenix, AZ (US); Paul Diglio, Gaston, OR (US); Varun Narayan, Tempe, AZ (US); Craig Yost, Gilbert, AZ (US); Jensen Stenberg, Phoenix, AZ (US); Kelly Lofgreen, Phoenix, AZ (US); Joseph Petrini, Gilbert, AZ (US); Sami Alelyani, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 333 days.

(21) Appl. No.: 18/071,399

(22) Filed: Nov. 29, 2022

(65) Prior Publication Data

US 2024/0175917 A1 May 30, 2024

(51) Int. Cl.
| | |
|---|---|
| *G01R 31/28* | (2006.01) |
| *G01R 31/26* | (2020.01) |
| *H01L 23/427* | (2006.01) |
| *H01L 23/467* | (2006.01) |
| *H01L 23/473* | (2006.01) |

(52) U.S. Cl.
CPC ..... *G01R 31/2877* (2013.01); *G01R 31/2863* (2013.01); *H01L 23/467* (2013.01)

(58) Field of Classification Search
CPC ........ G01R 31/02; G01R 31/26; G01R 31/28; H01L 23/427; H01L 23/467; H01L 23/473
See application file for complete search history.

(56) References Cited

U.S. PATENT DOCUMENTS

2021/0351106 A1* 11/2021 Subrahmanyam ........................ G01R 31/2642

* cited by examiner

*Primary Examiner* — Neel D Shah
(74) *Attorney, Agent, or Firm* — Eversheds Sutherland (US) LLP

(57) ABSTRACT

This disclosure describes systems, methods, and devices related to preventing water leakage from jet impingement applied to an integrated circuit under test. An integrated circuit testing apparatus for applying jet impingement to an integrated circuit may include an impingement chamber in contact with an integrated circuit being tested, the impingement chamber comprising water associated with cooling the integrated circuit; and an actuator-driven thermal management block including an air inlet configured to direct a flow of air into an immediate test environment for the integrated circuit to generate a positive pressure differential with respect to the water in the impingement chamber to prevent leakage of the water from the impingement chamber.

17 Claims, 3 Drawing Sheets

ENHANCED JET IMPINGEMENT LEAK PREVENTION FOR INTEGRATED CIRCUIT

TECHNICAL FIELD

This disclosure generally relates to devices, systems, and methods for eliminating water leaks during testing of integrated circuits and, more particularly, to an enhanced air seal for jet impingement socket for testing of integrated circuits.

BACKGROUND

Jet impingement is a liquid cooling technique to cool electronic devices by introducing a stream of liquid to a solid surface. However, jet impingement may result in leaks that may damage integrated circuit test equipment and the integrated circuit.

DETAILED DESCRIPTION

Figure 1:
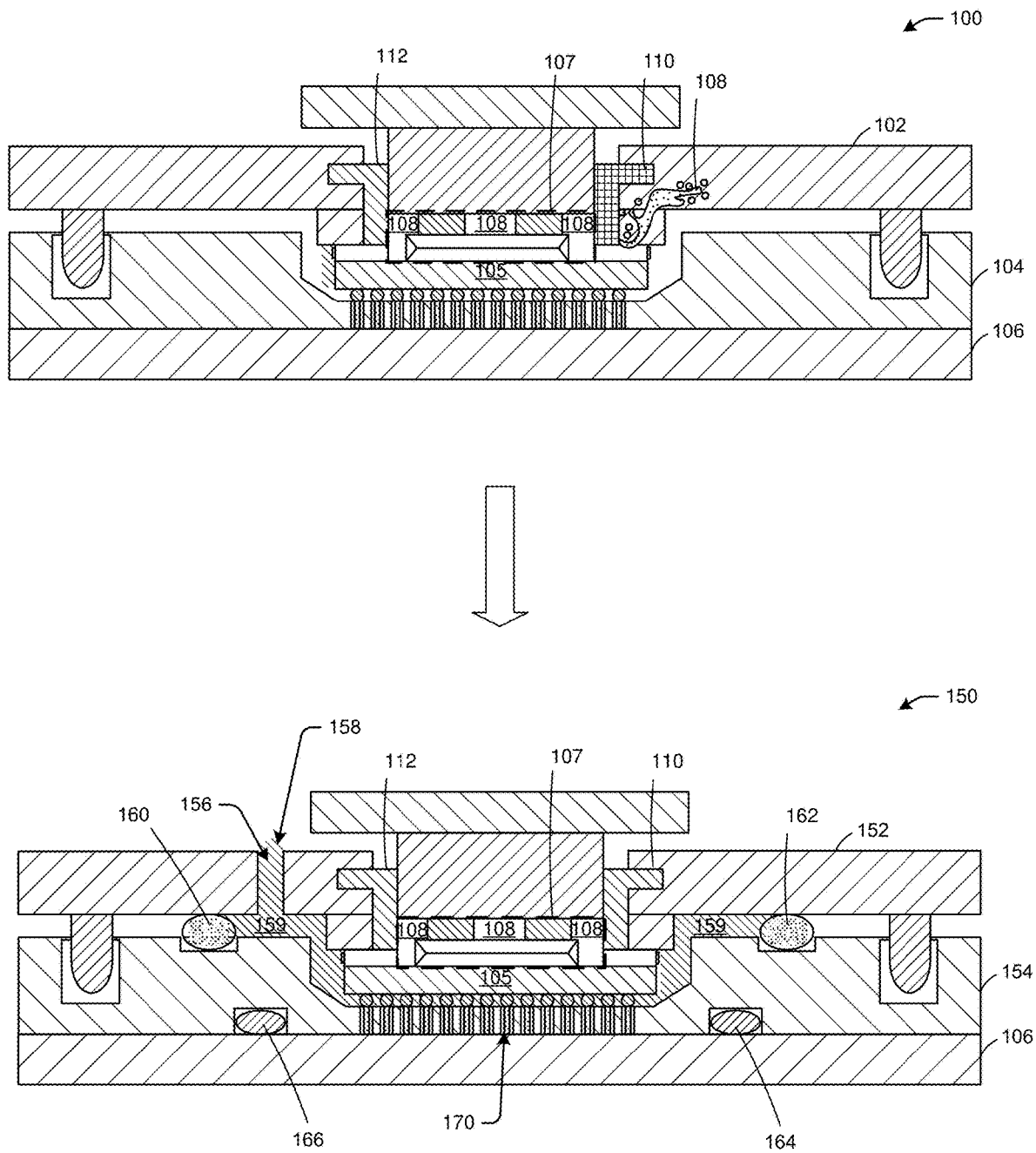
FIG. 1 illustrates cross-sections of example systems for jet impingement of integrated circuits, according to some example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

Jet impingement is a cooling technique that has been applied to integrated circuits. Introducing a cool liquid like water to surfaces of an integrated circuit may affect heat transfer. However, water leaks are possible in jet impingement techniques for integrated circuits, and may damage the chip and/or chip testing equipment.

Some existing techniques to prevent leaks in jet impingement for integrated circuits may use a rubber seal to contain water in a jet impingement chamber. While such existing techniques may work sufficiently for benchtops and a limited number of cycles, seals tend to degrade over time, which may occur more often in a high-volume environment. When a seal becomes marginal in performance, there is not a redundancy or safety net to prevent failure caused by leakage from jet impingement.

In one or more embodiments, to prevent leakage in jet impingement for integrated circuits, an air seal socket may be implemented. In particular, the air seal socket may use the concept of differential pressure to protect integrated circuit test equipment, allowing for creation of a higher-pressure environment around the impingement chamber so that if the chamber seal fails, air may leak into the chamber rather than out to the cell. As a result, not only would test equipment be protected, but also the detection of marginal seals may be easier because higher-pressure air would reduce the chamber performance to a level where it may be detected quickly by a process systems control. Benefits of the air seal socket using differential pressure include enabling jet impingement technology for a next generation of test thermal technology, and reducing the total cost of ownership and test unit cost by eliminating the possibility of water-induced damage to test equipment.

In one or more embodiments, the impingement chamber may be between the device under test (DUT) and an actuator-driven thermal management block, which is equipment with an impingement seal. This chamber may contain water in liquid and/or gaseous form throughout testing, and may be considered to be at a "lower pressure." A classic impingement chamber may rely on a seal to keep the fluid in, and should the seal fail, the water inside the chamber will leak out and damage test equipment. The enhancement described herein implements a socket top air seal that allows for creating a higher-pressure area around the impingement chamber. High-pressure air is injected from the actuator-driven thermal management block to increase the pressure of this area. Additionally, a socket bottom air seal may be needed to prevent the high-pressure air from leaking out through the socket pins.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 illustrates cross-sections of example systems for jet impingement of integrated circuits, according to some example embodiments of the present disclosure.

Referring to FIG. 1, a jet impingement system 100 may include an actuator-driven thermal management block 102 that actuates onto (e.g., in contact with) a socket 104 for connecting an integrated circuit 105 to a circuit board 106. An impingement chamber 107 may be between the device under test (e.g., the integrated circuit 105) and the actuator-driven thermal management block 102, and may contain liquid or gaseous water 108 for cooling the integrated circuit 105. The device under test may have impingement seals (e.g., seal 110 and seal 112) to prevent water 108 leakage. However, when a seal fails (e.g., the seal 110 as shown in FIG. 1), the water 108 may leak from the impingement chamber 107 and result in damage.

Still referring to FIG. 1, a jet impingement system 150 may include an actuator-driven thermal management block 152 that actuates onto (e.g., in contact with) a socket 154 for connecting the integrated circuit 105 to the circuit board 106. The impingement chamber 107 may include the water 108, and the device under test (e.g., the integrated circuit 105) may have the seals 110 and 112 to prevent water 108 leakage. In addition, the actuator-driven thermal management block 152 may have one or more air inlets 156 through which high-pressure air 158 may be introduced and directed to an immediate test environment 159 between the actuator-driven thermal management block 102 and the socket 154, and in between the integrated circuit 105 and the circuit board 106. The immediate test environment 159 therefore may at least partially surround the integrated circuit 105, the socket 154, and the actuator-driven thermal management block 102. By having the air 158 at a higher pressure than the water 108 in the impingement chamber 107, the air 158 pressure should prevent water 108 leakage even in the event of a failure of one of the seals 110 or 112. To maintain the air 158 to prevent water 108 leakage, socket seals may be included in the socket 154 (e.g., seal 160, seal 162, seal 164, seal 166 as one or more air 158 seal). The positions of the seal may vary, and seal may be placed on both sides of the integrated circuit 105, both on the top surface of the socket 154 (e.g., proximal to the actuator-driven thermal management block 152) and on the bottom surface of the socket 154 (e.g., proximal to the circuit board 106).

Figure 3:
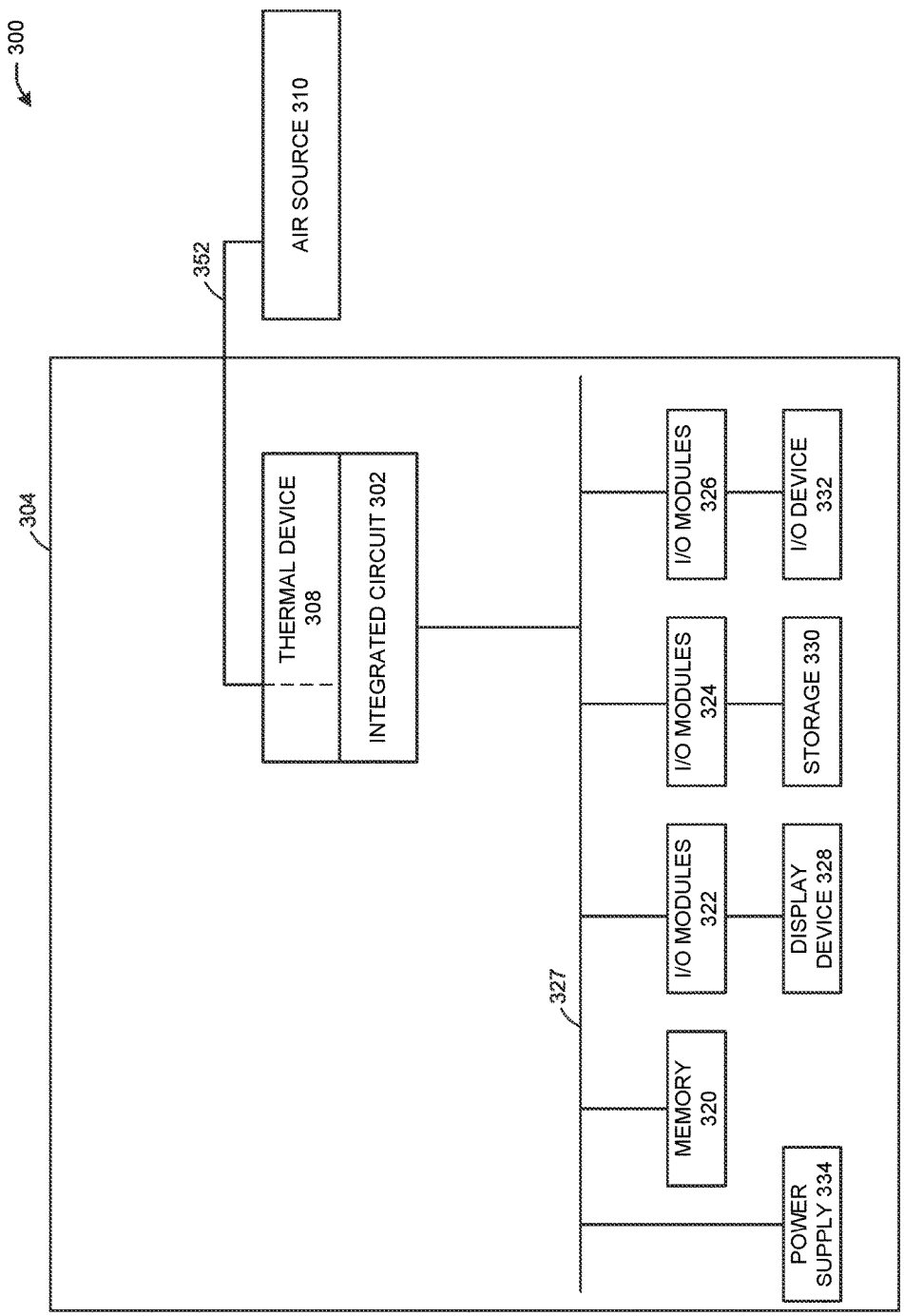
FIG. 3 is a block diagram of a system for jet impingement of integrated circuits, in accordance with one or more example embodiments of the present disclosure.

In one or more embodiments, the air 158 may be injected into the air inlet 156 via the actuator-driven thermal management block 152 (e.g., using the air tube 352 of FIG. 3 connecting to the air inlet 156). The impingement chamber 107 may include a flow meter to detect the air 158 flow rate. In a no-leak scenario, the air 158 should be static (e.g., pressurized with zero flow rate). Should either seal 110 or 112 fail, the air 158 would leak into the impingement chamber 107, creating a flow rate of the air 158. The flow rate of the air 158 may be characterized, and if the flow rate of the air 158 is greater than a flow rate threshold, an alarm may be generated (e.g., using the system 300 of FIG. 3) to indicate that the seal 100 and/or 112 have become marginal.

In one or more embodiments, the seal 160 and the seal 162 may function like an O-ring to create seals. The seal 164 and the seal 166 may be needed between the circuit board 106 and the socket 154 to prevent air 158 leakage (e.g., through the pins 170 of the integrated circuit 105). seal 164 and the seal 166 also may function as O-rings. The seals may use silicone and/or other materials, such as rubber/elastomers.

Figure 2:
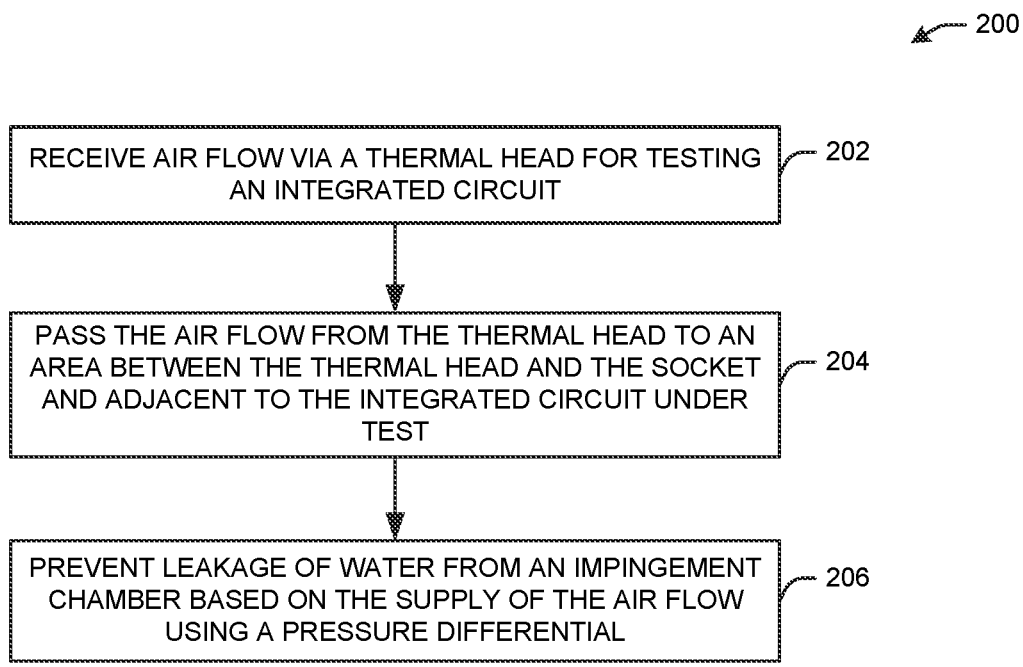
FIG. 2 illustrates a flow diagram of an illustrative process for jet impingement of integrated circuits in accordance with one or more example embodiments of the present disclosure.

FIG. 2 illustrates a flow diagram of an illustrative process 200 for jet impingement of integrated circuits in accordance with one or more example embodiments of the present disclosure.

At block 202, an integrated circuit jet impingement system (e.g., the jet impingement system 150 of FIG. 1) may receive a flow of air (e.g., the air 158 of FIG. 1) through one or more inlets in an actuator-driven thermal management block (e.g., the actuator-driven thermal management block 152 of FIG. 1). The air flow may be supplied by an air supply (e.g., the air source 350 of FIG. 3), which may have a pressure regulator to control the amount and pressure of air supplied (e.g., via the air tube 352 of FIG. 3).

At block 204, the system may pass the received air through the one or more inlets into an area between the actuator-driven thermal management block and a socket (e.g., the socket 154 of FIG. 1). The area may be adjacent to the device (e.g., the integrated circuit 105 of FIG. 1) under test and to an impingement chamber (e.g., the impingement chamber 107 of FIG. 1).

At block 206, the system may prevent leakage of water from the impingement chamber by supplying the air to generate an air pressure greater than the water pressure exerted from the impingement chamber, keeping the water in the impingement chamber. The expected flow of air should be zero, so if a flow rate of the air greater than a threshold is detected, it may be presumed that the seals have been breached. In this manner, flow rate measurements using a flow meter may be used to detect leakage.

FIG. 3 is a block diagram of a system 300 for jet impingement of integrated circuits, in accordance with one or more example embodiments of the present disclosure.

Referring to FIG. 3, an electrical component as a device under test may be an integrated circuit 302 (e.g., representing the integrated circuit 105 of FIG. 1). The integrated circuit 302 may be directly coupled to a printed circuit board (PCB) 304 (e.g., representing the circuit board 106 of FIG. 1), or indirectly coupled by way of a socket (e.g., the socket 154 of FIG. 1). The PCB 304 may be a motherboard, for example. A thermal device 308 (e.g., including the actuator-driven thermal management block 152 of FIG. 1) may be in contact with the integrated circuit 302 under test. Air from an air source 310 may be introduced to the integrated circuit 302 (e.g., using one or more air tubes 311).

Additionally, the system 300 may include a main memory 320 and one or more input/output (I/O) modules 322, 324 and/or 326. These elements including the earlier described integrated circuit 302 may be coupled to each other via a bus 327. The system 300 may further include a display device 328, a storage device 330, an input/output (I/O) device 332 (e.g., capable of presenting an alarm indicating seal failure), and a power supply 334 coupled to the bus 327 via respective input/output (I/O) modules 322, 324, and 326. Examples of the memory include, but are not limited to, static random access memory (SRAM) and dynamic random access memory (DRAM). The memory may also include cache memory. Examples of the display device may include, but are not limited to, a liquid crystal display (LCD), cathode ray tube (CRT), light-emitting diode (LED), gas plasma, or other image projection technology. Examples of the mass storage device include, but are not limited to, a hard disk drive, a compact disk (CD) drive, a digital versatile disk (DVD) drive, a floppy diskette, a tape system, and so forth. Examples of the input/output devices may include, but are not limited to, devices which may be suitable for communication with a computer user, for example a keyboard, a mouse, a microphone, a voice recognition device, a display, a printer, speakers, and a scanner. The system may be included within, or include, a cell phone or a personal digital assistant (PDA).

Various embodiments of the invention can also be used to thermally manage other components, for example, a memory module, or discrete components such as capacitors or resistors and the like.

The system 300 also may include the air source 310 with which to provide the air 158 of FIG. 1 for creating an air pressure to overcome the jet impingement water pressure and thereby prevent water leakage. The air source 310 may include a pressure regulator for adjusting and controlling the pressure of air (e.g., through the air tube 311) to the thermal device 308.

It is understood that the above descriptions are for purposes of illustration and are not meant to be limiting.

As used in this application, the terms "system" and "component" and "module" are intended to refer to a computer-related entity, either hardware, a combination of hardware and software, software, or software in execution, examples of which are provided by the exemplary system 600. For example, a component can be, but is not limited to being, a process running on a processor, a processor, a hard disk drive, multiple storage drives (of optical and/or magnetic storage medium), an object, an executable, a thread of execution, a program, and/or a computer.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code to reduce the number of times code must be retrieved from bulk storage during execution. The term "code" covers a broad range of software components and constructs, including applications, drivers, processes, routines, methods, modules, firmware, microcode, and subprograms. Thus, the term "code" may be used to refer to any collection of instructions that, when executed by a processing system, perform a desired operation or operations.

Logic circuitry, devices, and interfaces herein described may perform functions implemented in hardware and implemented with code executed on one or more processors. Logic circuitry refers to the hardware or the hardware and code that implements one or more logical functions. Circuitry is hardware and may refer to one or more circuits. Each circuit may perform a particular function. A circuit of the circuitry may comprise discrete electrical components interconnected with one or more conductors, an integrated circuit, a chip package, a chipset, memory, or the like. Integrated circuits include circuits created on a substrate such as a silicon wafer and may comprise components. Integrated circuits, processor packages, chip packages, and chipsets may comprise one or more processors.

Processors may receive signals such as instructions and/or data at the input(s) and process the signals to generate at least one output. While executing code, the code changes the physical states and characteristics of transistors that make up a processor pipeline. The physical states of the transistors translate into logical bits of ones and zeros stored in registers within the processor. The processor can transfer the physical states of the transistors into registers and transfer the physical states of the transistors to another storage medium.

A processor may comprise circuits to perform one or more sub-functions implemented to perform the overall function of the processor. One example of a processor is a state machine or an application-specific integrated circuit (ASIC) that includes at least one input and at least one output. A state machine may manipulate the at least one input to generate the at least one output by performing a predetermined series of serial and/or parallel manipulations or transformations on the at least one input.

The logic as described above may be part of the design for an integrated circuit chip. The chip design is created in a graphical computer programming language, and stored in a computer storage medium or data storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a processor board, a server platform, or a motherboard, or (b) an end product.

The word "exemplary" is used herein to mean "serving as an example, instance, or illustration." Any embodiment described herein as "exemplary" is not necessarily to be construed as preferred or advantageous over other embodiments.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

The following examples pertain to further embodiments.

Example 1 may include an integrated circuit testing apparatus for applying jet impingement to an integrated circuit, the integrated circuit testing apparatus comprising: an impingement chamber in contact with an integrated circuit being tested, the impingement chamber comprising water associated with cooling the integrated circuit; and an actuator-driven thermal management block comprising an air inlet configured to direct a flow of air into an immediate test environment for the integrated circuit to generate a positive pressure differential with respect to the water in the impingement chamber to prevent leakage of the water from the impingement chamber.

Example 2 may include the integrated circuit testing apparatus of example 1 and/or any other example herein, wherein the air inlet extends through the actuator-driven thermal management block.

Example 3 may include the integrated circuit testing apparatus of example 1 and/or any other example herein, wherein the immediate test environment at least partially surrounds the integrated circuit, a socket arranged between the integrated circuit and a circuit board connected to the integrated circuit, and the actuator-driven thermal management block.

Example 4 may include the integrated circuit testing apparatus of example 1 and/or any other example herein, further comprising impingement seals in the impingement chamber and associated with preventing leakage of the water from the impingement chamber.

Example 5 may include the integrated circuit testing apparatus of example 1 and/or any other example herein, further comprising a first O-ring seal and a second O-ring seal, the first O-ring seal and the second O-ring seal between the actuator-driven thermal management block and a socket arranged between the integrated circuit and a circuit board.

Example 6 may include the integrated circuit testing apparatus of example 5 and/or any other example herein, further comprising a third O-ring seal and a fourth O-ring seal, the third O-ring seal and the fourth O-ring seal between the socket and the circuit board.

Example 7 may include the integrated circuit testing apparatus of example 5 and/or any other example herein, wherein the first O-ring seal and the second O-ring seal comprise an elastomer.

Example 8 may include the integrated circuit testing apparatus of example 5 and/or any other example herein, wherein the first air seal and the second air seal comprise silicone.

Example 9 may include an integrated circuit testing system for applying jet impingement to an integrated circuit, the integrated circuit testing apparatus comprising: an impingement chamber in contact with an integrated circuit being tested, the impingement chamber comprising water associated with cooling the integrated circuit; a socket arranged between the integrated circuit and a circuit board and with which the integrated circuit connects to the circuit board; and an actuator-driven thermal management block comprising an air inlet configured to direct a flow of air into an immediate test environment for the integrated circuit to generate a positive pressure differential with respect to the water in the impingement chamber to prevent leakage of the water from the impingement chamber.

Example 10 may include the integrated circuit testing system of example 9 and/or any other example herein, wherein the air inlet extends through the actuator-driven thermal management block.

Example 11 may include the integrated circuit testing system of example 9 and/or any other example herein, wherein the immediate test environment at least partially surrounds the integrated circuit, a socket arranged between the integrated circuit and a circuit board connected to the integrated circuit, and the actuator-driven thermal management block.

Example 12 may include the integrated circuit testing system of example 9 and/or any other example herein, further comprising impingement seals in the impingement chamber and associated with preventing leakage of the water from the impingement chamber.

Example 13 may include the integrated circuit testing system of example 9 and/or any other example herein, further comprising a first O-ring seal and a second O-ring seal, the first O-ring seal and the second O-ring seal between the actuator-driven thermal management block and the socket.

Example 14 may include the integrated circuit testing system of example 13 and/or any other example herein, further comprising a third O-ring seal and a fourth O-ring seal, the third O-ring seal and the fourth O-ring seal between the socket and the circuit board.

Example 15 may include the integrated circuit testing system of example 13 and/or any other example herein, wherein the first O-ring seal and the second O-ring seal comprise an elastomer.

Example 16 may include the integrated circuit testing system of example 5 and/or any other example herein, wherein the first O-ring seal and the second O-ring seal comprise silicone.

Example 17 may include a method for applying jet impingement to an integrated circuit being tested, the method comprising: receiving, by an inlet of an actuator-driven thermal management block associated with testing of the integrated circuit, a flow of air associated with preventing leakage of water from an impingement chamber; and directing, by the inlet, the flow of air through the actuator-driven thermal management block to an immediate test environment for the integrated circuit to generate a positive pressure differential with respect to the water in the impingement chamber to prevent leakage of the water from the impingement chamber; and limiting the flow of air using seals in a socket through which the integrated circuit connects to a circuit board.

Example 18 may include the method of example 17 and/or any other example herein, further comprising preventing leaking of the water from the impingement chamber.

Example 19 may include the method of example 17 and/or any other example herein, wherein the seals comprise an elastomer.

Example 20 may include the method of example 17 and/or any other example herein, wherein the seals comprise silicone.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. An integrated circuit testing apparatus for applying jet impingement to an integrated circuit, the integrated circuit testing apparatus comprising:
    an actuator-driven thermal management block comprising seals and an air inlet configured to direct a flow of air into an immediate test environment for an integrated circuit to generate a positive pressure differential with respect to water in an impingement chamber to prevent leakage of the water from the impingement chamber, the impingement chamber formed by the integrated circuit, the actuator-driven thermal management block, and the seals.

2. The integrated circuit testing apparatus of claim 1, wherein the air inlet extends through the actuator-driven thermal management block.

3. The integrated circuit testing apparatus of claim 1, wherein the immediate test environment at least partially surrounds the integrated circuit, a socket arranged between the integrated circuit and a circuit board connected to the integrated circuit, and the actuator-driven thermal management block.

4. The integrated circuit testing apparatus of claim 1, further comprising a first O-ring seal and a second O-ring seal, the first O-ring seal and the second O-ring seal between the actuator-driven thermal management block and a socket arranged between the integrated circuit and a circuit board.

5. The integrated circuit testing apparatus of claim 4, further comprising a third O-ring seal and a fourth O-ring seal, the third O-ring seal and the fourth O-ring seal between the socket and the circuit board.

6. The integrated circuit testing apparatus of claim 4, wherein the first O-ring seal and the second O-ring seal comprise an elastomer.

7. The integrated circuit testing apparatus of claim 4, wherein the first O-ring seal and the second O-ring seal comprise silicone.

8. The integrated circuit testing system of claim 4, wherein the first O-ring seal and the second O-ring seal comprise silicone.

9. An integrated circuit testing system for applying jet impingement to an integrated circuit, the integrated circuit testing apparatus comprising:
    a socket arranged between an integrated circuit and a circuit board and with which the integrated circuit connects to the circuit board; and
    an actuator-driven thermal management block comprising seals and an air inlet configured to direct a flow of air into an immediate test environment for the integrated circuit to generate a positive pressure differential with respect to water in an impingement chamber to prevent leakage of the water from the impingement chamber, the impingement chamber formed by the integrated circuit, the actuator-driven thermal management block, and the seals.

10. The integrated circuit testing system of claim 9, wherein the air inlet extends through the actuator-driven thermal management block.

11. The integrated circuit testing system of claim 9, wherein the immediate test environment at least partially surrounds the integrated circuit, a socket arranged between the integrated circuit and a circuit board connected to the integrated circuit, and the actuator-driven thermal management block.

12. The integrated circuit testing system of claim 9, further comprising a first O-ring seal and a second O-ring seal, the first O-ring seal and the second O-ring seal between the actuator-driven thermal management block and the socket.

13. The integrated circuit testing system of claim 12, further comprising a third O-ring seal and a fourth O-ring seal, the third O-ring seal and the fourth O-ring seal between the socket and the circuit board.

14. The integrated circuit testing system of claim 12, wherein the first O-ring seal and the second O-ring seal comprise an elastomer.

15. A method for applying jet impingement to an integrated circuit being tested, the method comprising:
    receiving, by an inlet of an actuator-driven thermal management block associated with testing of the integrated circuit, a flow of air associated with preventing leakage of water from an impingement chamber, the impingement chamber formed by the integrated circuit, the actuator-driven thermal management block, and first seals; and
    directing, by the inlet, the flow of air through the actuator-driven thermal management block to an immediate test environment for the integrated circuit to generate a positive pressure differential with respect to the water in the impingement chamber to prevent leakage of the water from the impingement chamber; and limiting the flow of air using second seals in a socket through which the integrated circuit connects to a circuit board.

16. The method of claim 15, wherein the second seals comprise an elastomer.

17. The method of claim 15, wherein the second seals comprise silicone.

* * * * *